(12) United States Patent
Okita

(10) Patent No.: US 10,704,163 B2
(45) Date of Patent: *Jul. 7, 2020

(54) SILICON CARBIDE SUBSTRATE AND METHOD FOR MANUFACTURING THE SAME

(71) Applicant: Sumitomo Electric Industries, Ltd., Osaka-shi, Osaka (JP)

(72) Inventor: Kyoko Okita, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 39 days.

This patent is subject to a terminal disclaimer.

(21) Appl. No.: 16/106,101

(22) Filed: Aug. 21, 2018

(65) Prior Publication Data

US 2018/0355513 A1 Dec. 13, 2018

Related U.S. Application Data

(63) Continuation of application No. 15/520,435, filed as application No. PCT/JP2015/074741 on Aug. 31, 2015, now Pat. No. 10,113,249.

(30) Foreign Application Priority Data

Oct. 23, 2014 (JP) .................................. 2014-216483

(51) Int. Cl.
*B32B 3/02* (2006.01)
*C30B 33/10* (2006.01)
*C30B 29/36* (2006.01)
*H01L 21/02* (2006.01)
*C30B 33/00* (2006.01)
(Continued)

(52) U.S. Cl.
CPC ............ *C30B 33/10* (2013.01); *B24B 37/042* (2013.01); *C30B 29/36* (2013.01); *C30B 33/00* (2013.01); *H01L 21/02008* (2013.01); *H01L 21/02052* (2013.01); *H01L 21/02057* (2013.01); *H01L 21/0475* (2013.01); *H01L 21/304* (2013.01);
(Continued)

(58) Field of Classification Search
CPC ......... C30B 33/00; C30B 33/10; C30B 29/36; B24B 37/042; H01L 21/02008; H01L 21/02052; H01L 21/0475; H01L 21/304; H01L 21/30625; H01L 21/67057; H01L 29/1608
See application file for complete search history.

(56) References Cited

U.S. PATENT DOCUMENTS

2003/0221703 A1 12/2003 Oguro
2009/0009090 A1 1/2009 Viol et al.
(Continued)

FOREIGN PATENT DOCUMENTS

CN 104023889 A 9/2014
CN 104112652 A 10/2014
(Continued)

*Primary Examiner* — Elizabeth E Mulvaney
(74) *Attorney, Agent, or Firm* — Faegre Drinker Biddle & Reath LLP

(57) ABSTRACT

A method for manufacturing a silicon carbide substrate includes steps of preparing a silicon carbide substrate having a main surface, polishing the main surface of the silicon carbide substrate using a polishing agent containing a metal catalyst, and cleaning the silicon carbide substrate after the step of polishing. The step of cleaning includes a step of cleaning the silicon carbide substrate with aqua regia.

4 Claims, 4 Drawing Sheets

(51) Int. Cl.
   *B24B 37/04*   (2012.01)
   *H01L 21/04*   (2006.01)
   *H01L 21/306*  (2006.01)
   *H01L 21/67*   (2006.01)
   *H01L 29/16*   (2006.01)
   *H01L 21/304*  (2006.01)

(52) U.S. Cl.
   CPC .. *H01L 21/30625* (2013.01); *H01L 21/67057* (2013.01); *H01L 29/1608* (2013.01)

(56) References Cited

U.S. PATENT DOCUMENTS

| | | |
|---|---|---|
| 2009/0095712 A1 | 4/2009 | Yamauchi et al. |
| 2013/0020585 A1 | 1/2013 | Ishibashi |
| 2013/0256700 A1 | 10/2013 | Ishibashi |
| 2014/0220299 A1 | 8/2014 | Yoshida et al. |
| 2014/0326612 A1 | 11/2014 | Yamauchi |
| 2015/0205196 A1 | 7/2015 | Orihara et al. |

FOREIGN PATENT DOCUMENTS

| | | |
|---|---|---|
| CN | 104114755 A | 10/2014 |
| JP | H11-157989 A | 6/1999 |
| JP | 2004-014536 A | 1/2004 |
| JP | 2008-280207 A | 11/2008 |
| JP | 2009-117782 A | 5/2009 |
| JP | 2009-194216 A | 8/2009 |
| JP | 2010-004073 A | 1/2010 |
| JP | 2010-182782 A | 8/2010 |
| JP | 2011-3769 A | 1/2011 |
| JP | 2011-230959 A | 11/2011 |
| WO | WO-2013/011751 A1 | 1/2013 |
| WO | WO 2014/050831 A1 | 4/2014 |

SILICON CARBIDE SUBSTRATE AND METHOD FOR MANUFACTURING THE SAME

This is a continuation application of copending application Ser. No. 15/520,435, having a § 371 date of Apr. 20, 2017, which is a national stage filing based on PCT International Application No. PCT/JP2015/074741, filed on Aug. 31, 2015. The copending application Ser. No. 15/520,435 is incorporated by reference herein in its entirety.

TECHNICAL FIELD

The present disclosure relates to a silicon carbide substrate and a method for manufacturing the same.

BACKGROUND ART

In recent years, in order to achieve high breakdown voltage, low loss, and the like in a semiconductor device, silicon carbide (SiC) has begun to be adopted as a material constituting the semiconductor device.

In the process of manufacturing a silicon carbide substrate, a silicon carbide substrate sliced from a silicon carbide ingot is polished to smooth a surface thereof, and thereafter the silicon carbide substrate is cleaned. For example, PTD 1 (Japanese Patent Laying-Open No. 2010-4073) discloses a technique of cleaning a silicon carbide substrate using an aqueous solution containing sulfuric acid and hydrogen peroxide water.

CITATION LIST

Patent Document

PTD 1: Japanese Patent Laying-Open No. 2010-4073

SUMMARY OF INVENTION

A silicon carbide substrate in accordance with the present disclosure is a silicon carbide substrate having a main surface, the main surface having a surface roughness (Ra) of less than or equal to 0.1 nm, and vanadium, tungsten, molybdenum, platinum, nickel, titanium, zirconium, and chromium each having a concentration of less than or equal to $1.0 \times 10^{12}$ atoms/cm$^2$ in the main surface.

A method for manufacturing a silicon carbide substrate in accordance with the present disclosure includes steps of preparing a silicon carbide substrate having a main surface, polishing the main surface of the silicon carbide substrate using a polishing agent containing a metal catalyst, and cleaning the silicon carbide substrate after the step of polishing. The step of cleaning includes a step of cleaning the silicon carbide substrate with aqua regia.

DESCRIPTION OF EMBODIMENTS

Description of Embodiment

Figure 1:
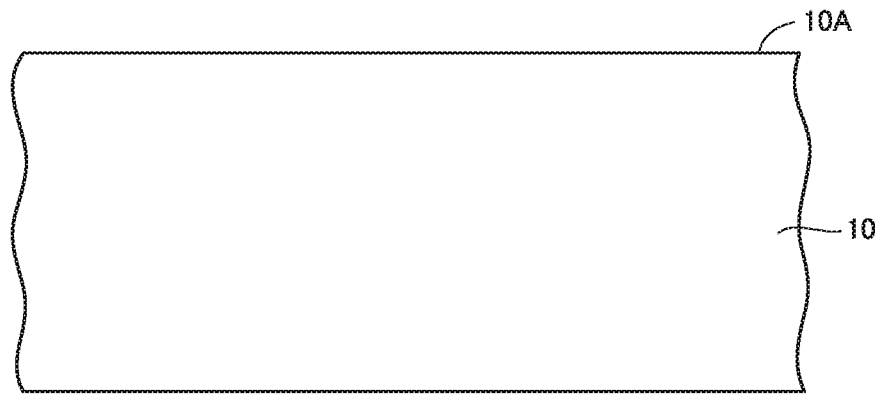
FIG. 1 is a partial cross sectional view showing a configuration of a silicon carbide substrate in accordance with a first embodiment.

To polish a silicon carbide substrate, for example, a chemical mechanical polishing method called CMP (Chemical Mechanical Polishing) is adopted. In the CMP method, for example, a polishing agent containing a metal catalyst which reforms a surface by a catalytic action to increase oxidizing power of an oxidizing agent is used in order to achieve a good surface roughness at a high polishing speed. By the metal catalyst, an oxide layer having a hardness lower than that of silicon carbide is formed on the surface of the silicon carbide substrate. Since polishing is promoted by removing the oxide layer by a mechanical force, both a high polishing speed and a good surface roughness can be achieved.

However, when a silicon carbide substrate is polished using a polishing agent containing a metal catalyst and thereafter a silicon carbide epitaxial layer (hereinafter also referred to as an epi layer) is grown on the silicon carbide substrate, the silicon carbide epi layer may locally grow abnormally, and may have a high surface roughness.

First, aspects of the present disclosure will be described in list form.

(1) A silicon carbide substrate in accordance with the present disclosure is a silicon carbide substrate having a main surface, the main surface having a surface roughness (Ra) of less than or equal to 0.1 nm, and vanadium, tungsten, molybdenum, platinum, nickel, titanium, zirconium, and chromium each having a concentration of less than or equal to $1.0 \times 10^{12}$ atoms/cm$^2$ in the main surface. Here, the main surface means a surface on which devices such as a transistor, a diode, and the like are to be formed.

The surface roughness (Ra) of the main surface of the silicon carbide substrate is easily set to less than or equal to 0.1 nm by using a polishing agent containing a metal catalyst in the CMP method.

The metal catalyst includes at least one metal element selected from the group consisting of vanadium, tungsten, molybdenum, platinum, nickel, titanium, zirconium, and chromium, for example. These metal elements have a catalytic action of breaking bonds between atoms arranged in a surface of silicon carbide to cause the surface to be easily oxidized. Thus, an oxide layer having a hardness lower than that of silicon carbide can be suitably formed on the main surface of the silicon carbide substrate. Accordingly, polishing of the silicon carbide substrate can be promoted.

However, even when the silicon carbide substrate is cleaned after being polished using the polishing agent containing the metal catalyst described above, a metal derived from the metal catalyst adhering to the main surface of the silicon carbide substrate may remain in the main surface. When an epi layer is grown on the silicon carbide substrate having the metal remaining in the main surface, material molecules of the epi layer may selectively adhere to a portion where the metal remains in an initial stage of epitaxial growth. As a result, the epi layer grows abnormally. When the epi layer partially grows abnormally, the epi layer has a high surface roughness. Accordingly, in order to reduce the surface roughness of the epi layer, it is required to reduce the metal remaining in the main surface of the silicon carbide substrate.

In the silicon carbide substrate described above, the surface roughness of the epi layer growing on the main surface of the silicon carbide substrate can be reduced.

(2) Preferably, in the silicon carbide substrate described above, vanadium, tungsten, molybdenum, platinum, nickel, titanium, zirconium, and chromium each have a concentration of less than or equal to $2.0 \times 10^{11}$ atoms/cm$^2$ in the main surface of the silicon carbide substrate.

(3) Preferably, in the silicon carbide substrate described above in (1) or (2), potassium, sodium, calcium, iron, copper, aluminum, and tin in the main surface of the silicon carbide substrate each have a concentration of less than or equal to $1.0 \times 10^{10}$ atoms/cm$^2$.

(4) Preferably, in the silicon carbide substrate described above in any of (1) to (3), the silicon carbide substrate has a diameter of more than or equal to 100 mm.

(5) A method for manufacturing a silicon carbide substrate in accordance with the present disclosure includes steps of preparing a silicon carbide substrate having a main surface, polishing the main surface of the silicon carbide substrate using a polishing agent containing a metal catalyst, and cleaning the silicon carbide substrate after the step of polishing. The step of cleaning includes a step of cleaning the silicon carbide substrate with aqua regia. By cleaning the silicon carbide substrate with the aqua regia after polishing it, the metal catalyst remaining in the main surface, which is a polished surface, of the silicon carbide substrate can be removed. Therefore, the surface roughness of the epi layer formed on the main surface can be reduced.

(6) Preferably, in the method for manufacturing the silicon carbide substrate described above, in the step of polishing, the polishing agent contains at least one metal element selected from the group consisting of vanadium, tungsten, molybdenum, platinum, nickel, titanium, zirconium, and chromium, as the metal catalyst.

(7) Preferably, in the method for manufacturing the silicon carbide substrate described above in (5) or (6), the step of cleaning further includes steps of cleaning the silicon carbide substrate with a sulfuric acid-hydrogen peroxide water mixture, and cleaning the silicon carbide substrate with an ammonia-hydrogen peroxide water mixture after the step of cleaning with the sulfuric acid-hydrogen peroxide water mixture. The step of cleaning with the aqua regia is performed after the step of cleaning with the ammonia-hydrogen peroxide water mixture. The step of cleaning further includes steps of cleaning the silicon carbide substrate with a hydrochloric acid-hydrogen peroxide water mixture after the step of cleaning with the aqua regia, and cleaning the silicon carbide substrate with hydrofluoric acid after the step of cleaning with the hydrochloric acid-hydrogen peroxide water mixture. Thereby, the metal catalyst and a metal other than the metal catalyst remaining in the main surface of the silicon carbide substrate can be reduced. The "metal other than the metal catalyst" includes, for example, at least one metal selected from the group consisting of potassium, sodium, calcium, iron, copper, aluminum, and tin, for example.

(8) Preferably, in the method for manufacturing the silicon carbide substrate described above in (7), a treatment time is set to more than or equal to 15 minutes in each of the steps of cleaning with the sulfuric acid-hydrogen peroxide water mixture, cleaning with the ammonia-hydrogen peroxide water mixture, cleaning with the aqua regia, cleaning with the hydrochloric acid-hydrogen peroxide water mixture, and cleaning with the hydrofluoric acid.

(9) Preferably, in the method for manufacturing the silicon carbide substrate described above in (5) or (6), the step of cleaning further includes a step of cleaning the silicon carbide substrate with art ammonia-hydrogen peroxide water mixture. The step of cleaning the silicon carbide substrate with the aqua regia is performed after the step of cleaning with the ammonia-hydrogen peroxide water mixture. Thereby, an organic substance adhering to the main surface of the silicon carbide substrate can be reduced, and the metal catalyst and the metal other than the metal catalyst remaining in the main surface of the silicon carbide substrate can be reduced.

(10) Preferably, in the method for manufacturing the silicon carbide substrate described above in (9), a treatment time is set to more than or equal to 15 minutes in each of the steps of cleaning with the ammonia-hydrogen peroxide water mixture and cleaning with the aqua regia.

(11) Preferably, in the method for manufacturing the silicon carbide substrate described above in (5) or (6), the step of cleaning further includes a step of cleaning the silicon carbide substrate with a sulfuric acid-hydrogen peroxide water mixture. The step of cleaning with the aqua regia is performed after the step of cleaning with the sulfuric acid-hydrogen peroxide water mixture. The step of cleaning further includes a step of cleaning the silicon carbide substrate with hydrofluoric acid after the step of cleaning with the aqua regia.

(12) In the method for manufacturing the silicon carbide substrate described above in (11), a treatment time is set to more than or equal to 15 minutes in each of the steps of cleaning with the sulfuric acid-hydrogen peroxide water mixture, cleaning with the aqua regia, and cleaning with the hydrofluoric acid.

(13) Preferably, in the method for manufacturing the silicon carbide substrate described above in any of (5) to (12), in the step of cleaning with the aqua regia, the aqua regia in a mixed solution prepared by mixing the aqua regia and ultrapure water has a volume concentration of more than or equal to 50% and less than or equal to 100%.

(14) Preferably, in the method for manufacturing the silicon carbide substrate described above in any of (7), (8), (11), and (12), in the step of cleaning with the sulfuric acid-hydrogen peroxide water mixture, a volume of sulfuric acid contained in the sulfuric acid-hydrogen peroxide water mixture is more than or equal to one time and less than or equal to five times a volume of ultrapure water contained in the sulfuric acid-hydrogen peroxide water mixture, and a volume of hydrogen peroxide water contained in the sulfuric acid-hydrogen peroxide water mixture is more than or equal to one time and less than or equal to three times the volume of the ultrapure water contained in the sulfuric acid-hydrogen peroxide water mixture.

(15) Preferably, in the method for manufacturing the silicon carbide substrate described above in any of (7) to (10), in the step of cleaning with the ammonia-hydrogen peroxide water mixture, a volume of an aqueous ammonia solution contained in the ammonia-hydrogen peroxide water mixture is more than or equal to one tenth and less than or equal to one time a volume of ultrapure water contained in the ammonia-hydrogen peroxide water mixture, and a volume of hydrogen peroxide water contained in the ammonia-hydrogen peroxide water mixture is more than or equal to one tenth and less than or equal to one time the volume of the ultrapure water contained in the ammonia-hydrogen peroxide water mixture.

(16) Preferably, in the method for manufacturing the silicon carbide substrate described above in any of (5) to (15), in the step of cleaning, the silicon carbide substrate is set to have a temperature of less than or equal to 40° C.

Details of Embodiment

Hereinafter, a specific example of an embodiment of the present disclosure will be described with reference to the drawings. It should be noted that identical or corresponding; parts in the following drawings will be designated by the same reference numerals, and the description thereof will not be repeated. Further, in the present specification, an individual plane is represented by ( ), and a group plane is represented by { }. In addition, a negative index is supposed to be crystallographically indicated by putting "-" (bar) above a numeral, but is indicated by putting the negative sign before the numeral in the present specification.

First Embodiment

<Configuration of Silicon Carbide Substrate>

First, a configuration of a silicon carbide substrate in accordance with a first embodiment will be described. FIG. 1 is a partial cross sectional view showing a configuration of a silicon carbide substrate 10 in accordance with the first embodiment.

As shown in FIG. 1, silicon carbide substrate 10 has a main surface 10A. Silicon carbide substrate 10 is made of a hexagonal silicon carbide single crystal having a polytype of 4H, for example. Silicon carbide substrate 10 contains an a type impurity such as nitrogen, for example. The impurity in silicon carbide substrate 10 has a concentration of for example, more than or equal to $5.0 \times 10^{18}$ cm$^{-3}$ and less than or equal to $2.0 \times 10^{19}$ cm$^{-3}$. Silicon carbide substrate 10 has a diameter of, for example, more than or equal to 100 mm (more than or equal to 4 inches), and may have a diameter of more than or equal to 150 mm (6 inches).

Main surface 10A has a surface roughness (Ra) of less than or equal to 0.1 nm. The "surface roughness (Ra)" is a value measured in conformity with JIS B0601. The surface roughness (Ra) can be measured, for example, using an atomic force microscope (AFM).

As an AFM, for example, "Dimension 300" manufactured by Veeco can be used. In addition, as a cantilever (probe) of the above AFM, for example, a model "NCHV-10V" manufactured by Bruker can be used. As conditions for measurement with the AFM, as one example, a measurement mode is set to a tapping mode, a measurement region in the tapping mode is set to a square having each side of 10 μm, a pitch is set to 40 nm, and a measurement depth is set to 1.0 μm. In addition, sampling in the tapping mode is performed under conditions that a scanning speed within the above measurement region is 5 seconds for one cycle, the number of data for each scan line is 512 points, and the number of the scan lines is 512. Further, displacement control for the cantilever is set to 15.50 nm.

Main surface 10A may be, for example, a {0001} plane, or a surface having a predetermined off angle (for example, an off angle of less than or equal to 10°) with respect to a {0001} plane.

Vanadium, tungsten, molybdenum, platinum, nickel, titanium, zirconium, and chromium in main surface 10A each have a concentration of more than or equal to $1.0 \times 10^6$ atoms/cm$^2$ and less than or equal to $10 \times 10^{12}$ atoms/cm$^2$. More preferably, potassium, sodium, calcium, iron, copper, aluminum, and tin in main surface 10A each have a concentration of less than or equal to $1.0 \times 10^{10}$ atoms/cm$^2$. The concentration of a metal impurity in main surface 10A can be measured by ICP-MS (Inductively Coupled Plasma Mass Spectrometry). Specifically, for example, ICP-MS7500 manufactured by Agillent can be used.

<Method for Manufacturing Silicon Carbide Substrate>

Figure 2:
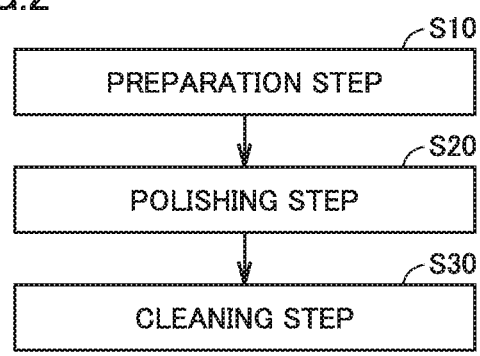
FIG. 2 is a flowchart for schematically illustrating a method for manufacturing time silicon carbide substrate in accordance with the first embodiment.

A method fir manufacturing silicon carbide substrate 10 in accordance with the first embodiment will be described. As shown in FIG. 2, the method for manufacturing silicon carbide substrate 10 in accordance with the present embodiment includes a preparation step (S10), a polishing step (S20), and a cleaning step (S30).

Figure 3:
FIG. 3 is a schematic view for illustrating one step in the method for manufacturing the silicon carbide substrate in accordance with the first embodiment.

In the preparation step (S10), silicon carbide substrate 10 cut out from a single crystal silicon carbide ingot is prepared. As shown in FIG. 3, silicon carbide substrate 10 in accordance with the present embodiment is made of a hexagonal silicon carbide single crystal having a polytype of 4H, for example, and has a main surface 11A.

Figure 4:
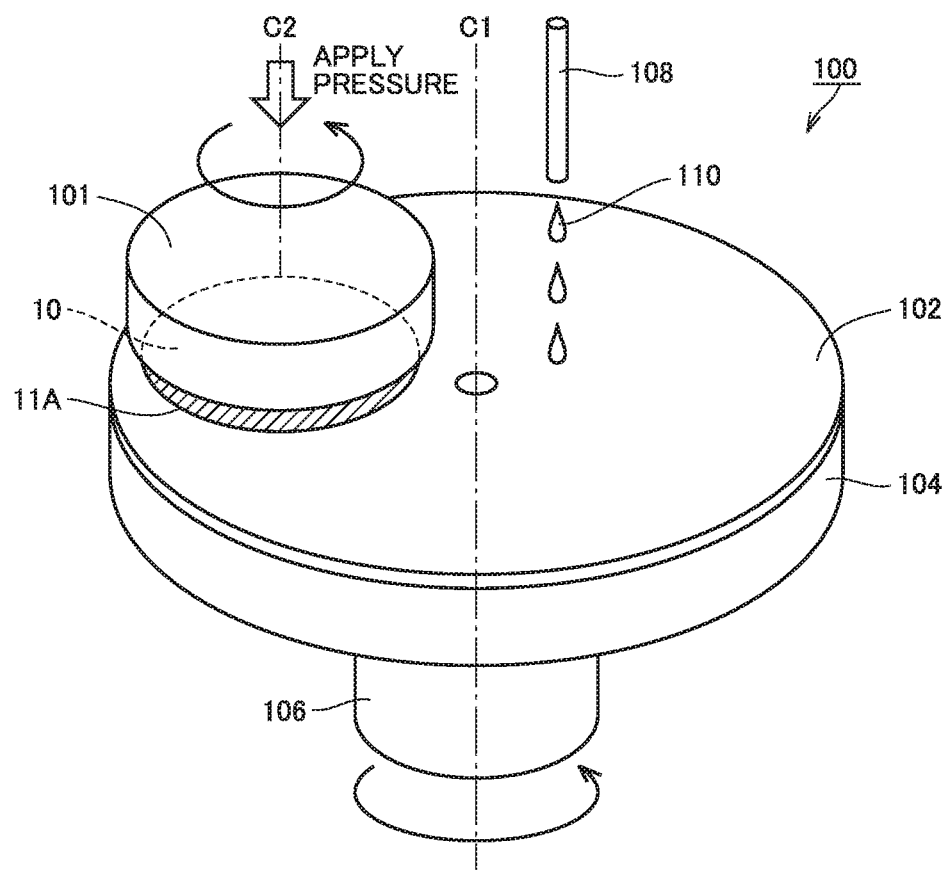
FIG. 4 is a schematic configuration diagram of a polishing apparatus used in polishing step.
Figure 5:
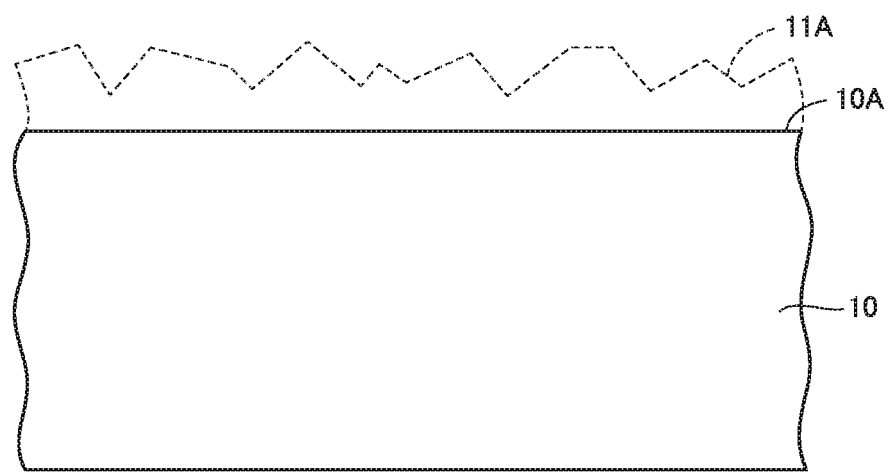
FIG. 5 is a schematic view for illustrating one step in the method for manufacturing the silicon carbide substrate in accordance with the first embodiment.

In a grinding step (S20), for example, a polishing apparatus 100 shown in FIG. 4 is used. As polishing apparatus 100, for example, a CMP apparatus is used. In the polishing step (S20), as shown in FIG. 5, new main surface 10A is formed by polishing main surface 11A. As shown in FIG. 4, polishing apparatus 100 used in the first embodiment includes a substrate holding portion 101, a turn table portion 104, a polishing cloth 102, and a polishing agent supplying portion 108. Substrate holding portion 101 includes a pressurizing head rotated by a shall not shown about a rotation axis C2. Turn table portion 104 includes a disk-like portion rotated by a shaft 106 about a rotation axis C1. Polishing cloth 102 is fixed an upper surface of turn table portion 104. Polishing agent supplying portion 108 for supplying a polishing agent 110 is provided above turn table portion 104.

When the polishing step (S20) is performed, silicon carbide substrate 10 is attached to a lower surface of the pressurizing head of substrate holding portion 101, and is arranged such that main surface 11A faces polishing cloth 102. Then, the pressurizing head is lowered to apply a predetermined pressure to silicon carbide substrate 10. Next, substrate holding portion 101 and turn table portion 104 are rotated in the same direction (direction indicated by arrows in FIG. 4) while supplying polishing agent 110 from polishing agent supplying portion 108 to polishing cloth 102. It should be noted that substrate holding portion 101 and turn table portion 104 may be rotated in opposite directions, or one of them may be rotated while the other is secured.

Polishing agent 110 used in the polishing step (S20) contains abrasive grains, an oxidizing agent, and a metal catalyst. The abrasive grains are a material which is softer than silicon carbide to reduce a surface roughness and a process-damaged layer. As the abrasive grains, for example, colloidal silica, fume silica, alumina, diamond, or the like is used. The oxidizing agent forms an oxide film on main surface 11A. As the oxidizing agent, for example, hydrogen peroxide water, sodium hypochlorite, barium percarbonate, or the like is used.

The metal catalyst includes at least one metal element selected from the group consisting of vanadium, tungsten, molybdenum, platinum, nickel, titanium, zirconium, and chromium. As the metal catalyst, for example, sodium tungstate, sodium vanadate, sodium molybdate, or the like is used.

Polishing agent 110 has a pH of preferably less than or equal to 6 or more than or equal to 9.5, and more preferably less than or equal to 4 or more than or equal to 10.5, to increase a chemical action. The pH of polishing agent 110 can be controlled by adding an inorganic acid such as hydrochloric acid, nitric acid, sulfuric acid, or phosphoric acid; an organic acid such as formic acid, acetic acid, oxalic acid, citric acid, malic acid, tartaric acid, succinic acid, phthalic acid, or fumaric acid; an inorganic alkali such as KOH, or NaOH, or $NH_4OH$, an organic alkali such as choline, amine, or TMAH (tetramethyl ammonium hydroxide), or a salt thereof.

Main surface 10A subjected to the polishing step (S20) has a surface roughness (Ra) of less than or equal to 0.1 nm. Foreign matter such as dust, the polishing agent used in the polishing step (S20), and the like may adhere to main surface 10A. Specifically, abrasive grains, an organic substance, a metal, and the like may adhere to main surface 10A. The metal adhering to main surface 10A derive from, for example, the metal catalyst contained in the polishing agent, or a surrounding environment.

Figure 6:
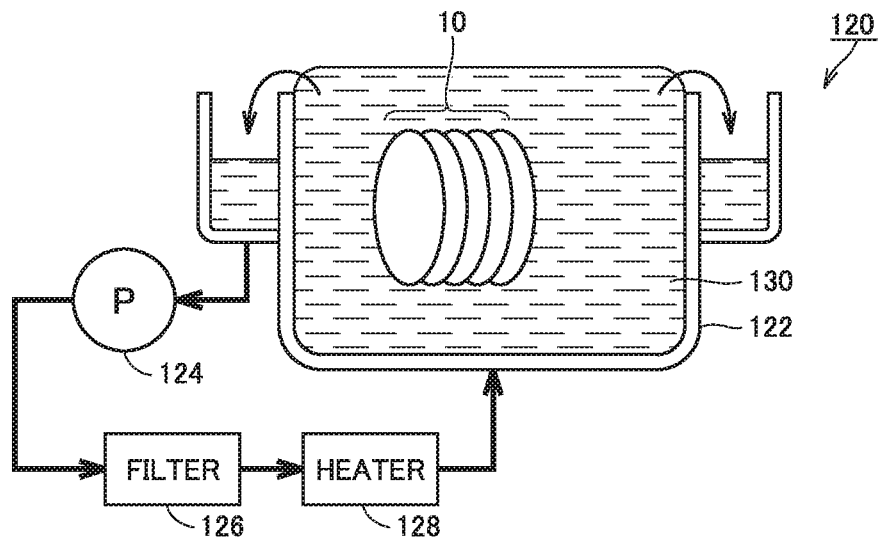
FIG. 6 is a schematic configuration diagram of a cleaning apparatus used cleaning step.

Next, the cleaning step (S30: FIG. 2) is performed. As shown in FIG. 6, a cleaning apparatus 120 used in the first embodiment includes a cleaning treatment tank 122, a pump 124, a filter 126, and a heater 128. Cleaning treatment is performed by immersing silicon carbide substrate 10 in cleaning treatment tank 122 filled with a cleaning solution 130 for a certain period of time. At least portions of the foreign matter such as dust, the organic substance, and the metals adhering to immersed main surface 10A dissolve in cleaning solution 130 and are removed. Cleaning solution 130 is always circulated by pump 124 and is filtered through filter 126. Further, cleaning solution 130 is maintained at a desired temperature by temperature control performed using heater 128.

Figure 7:
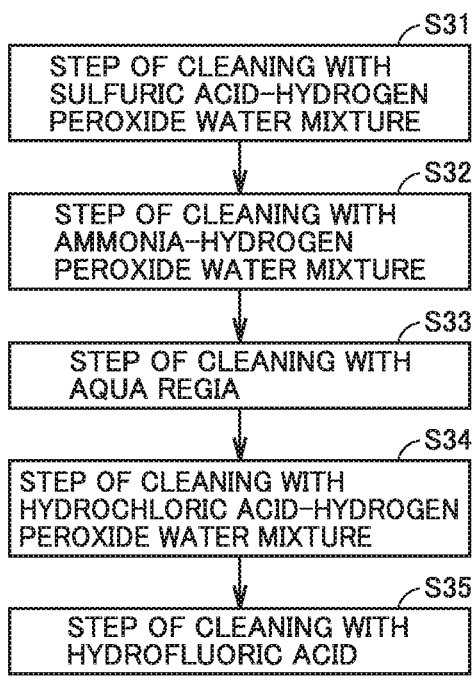
FIG. 7 is a flowchart for schematically illustrating a cleaning method in the method for manufacturing the silicon carbide substrate in accordance with the first embodiment.

As shown in FIG. 7, the cleaning step (S30) includes a plurality of steps performed in order of cleaning with a sulfuric acid-hydrogen peroxide water mixture (S31), cleaning with an ammonia-hydrogen peroxide water mixture (S32), cleaning with aqua regia (S33), cleaning with a hydrochloric acid-hydrogen peroxide water mixture (S34), and cleaning with hydrofluoric acid (S35), for example. A step of cleaning with ultrapure water may be performed after each step of cleaning is finished, to rinse the cleaning solution and the like remaining in main surface 110A. As the ultrapure water, for example, water having an electrical resistivity of more than or equal to 15 MΩ·cm, a total organ carbon (TOC) of less than 10 ppb, and a residual silica of less than 10 ppb can be used. The same applies to ultrapure water used in subsequent steps.

It should be noted that an alkali cleaning step may be performed before the step of cleaning with the sulfuric acid-hydrogen peroxide water mixture. In the alkali cleaning step, abrasive grains such as colloidal silica adhering to main surface 10A in the polishing step (S20) are removed by TMAH and a surface active agent, for example.

In the step of cleaning with the sulfuric acid-hydrogen peroxide water mixture (S31), the organic substance and the like adhering to main surface 10A are removed by the sulfuric acid-hydrogen peroxide water mixture. The sulfuric acid-hydrogen peroxide water mixture is a solution prepared by mixing sulfuric acid, hydrogen peroxide water, and ultrapure water. As the sulfuric acid, for example, concentrated sulfuric acid having a mass percentage concentration of 98% can be used. As the hydrogen peroxide water, for example, hydrogen peroxide water having a mass percentage concentration of 30% can be used. The same applies to hydrogen peroxide water used in subsequent steps.

The volume ratio among the sulfuric acid the hydrogen peroxide water, and the ultrapure water contained in the sulfuric acid-hydrogen peroxide water mixture is, for example, 1 (sulfuric acid):1 (hydrogen peroxide water):1 (ultrapure water). Preferably, the volume ratio among the sulfuric acid, the hydrogen peroxide water, and the ultrapure water is 1 (sulfuric acid):1 (hydrogen peroxide water):1 (ultrapure water) to 5 (sulfuric acid):3 (hydrogen peroxide water):1 (ultrapure water). In other words, the volume of the sulfuric acid is more than or equal to one time and less than or equal to five times the volume of the ultrapure water, and the volume of the hydrogen peroxide water is more than or equal to one time and less than or equal to three times the volume of the ultrapure water.

Next, in the step of cleaning with the ammonia-hydrogen peroxide water mixture (S32), the organic substance adhering to main surface 10A is removed by the ammonia-hydrogen peroxide water mixture. The ammonia-hydrogen peroxide water mixture is a solution prepared by mixing an aqueous ammonia solution, hydrogen peroxide water, and ultrapure water. As the aqueous ammonia solution, for example, an aqueous ammonia solution having a mass percentage concentration of 28% can be used.

The volume ratio among the aqueous ammonia solution, the hydrogen peroxide water, and the ultrapure water contained in the ammonia-hydrogen peroxide water mixture is, for example, 1 (aqueous ammonia solution):1 (hydrogen peroxide water):10 (ultrapure water). Preferably, the volume ratio among the aqueous ammonia solution, the hydrogen peroxide water, and the ultrapure water is 1 (aqueous ammonia solution):1 (hydrogen peroxide water):10 (ultrapure water) to 1 (aqueous ammonia solution):1 (hydrogen peroxide water):1 (ultrapure water). In other words, the volume of the aqueous ammonia solution is more than or equal to one tenth and less than or equal to one time the volume of the ultrapure water, and the volume of the hydrogen peroxide water is more than or equal to one tenth and less than or equal to one time the volume of the ultrapure water.

Next, in the step of cleaning with the aqua regia (S33), at least a portion of the metal derived from the metal catalyst remaining in main surface 10A is removed by the aqua regia. That is, the metals remaining in main surface 10A are reduced. The aqua regia is a solution prepared by mixing hydrochloric acid and nitric acid. In the present specification, the "aqua regia" refers to not only a solution prepared by mixing hydrochloric acid and nitric acid, but also a mixed solution of the solution and ultrapure water. In the first embodiment, the volume ratio among the hydrochloric acid, the nitric acid, and the ultrapure water contained in the aqua regia is, for example, 3 (hydrochloric acid):1 (nitric acid):0 (ultrapure water). Preferably, the volume ratio among the hydrochloric acid, the nitric acid, and the ultrapure water is 3 (hydrochloric acid):1 (nitric acid) 0 (ultrapure water) to 3 (hydrochloric acid):1 (nitric acid):2 (ultrapure water). Preferably, in a mixed solution prepared by mixing aqua regia (a mixed solution of hydrochloric acid and nitric acid) and ultrapure water, the aqua regia has a volume concentration of more than or equal to 50% and less than or equal to 100%.

Next, in the step of cleaning with the hydrochloric acid-hydrogen peroxide water mixture (S34), at least a portion of the metal remaining in main surface 10A other than the metal derived from the metal catalyst is removed by the hydrochloric acid-hydrogen peroxide water mixture. The hydrochloric acid-hydrogen peroxide water mixture is a solution prepared by mixing hydrochloric acid, hydrogen peroxide water, and ultrapure water. As the hydrochloric acid, for example, concentrated hydrochloric acid having a mass percentage concentration of 98% can be used.

The volume ratio among the hydrochloric acid, the hydrogen peroxide water, and the ultrapure water contained in the hydrochloric acid-hydrogen peroxide water mixture is, for example, 1 (hydrochloric acid):1 (hydrogen peroxide water):10 (ultrapure water). Preferably, the volume ratio among the hydrochloric acid, the hydrogen peroxide water, and the ultrapure water is 1 (hydrochloric acid):1 (hydrogen peroxide water):10 (ultrapure water) to 1 (hydrochloric acid):1 (hydrogen peroxide water):5 (ultrapure water). In other words, the volume of the hydrochloric acid is more than or equal to one tenth and less than or equal to one fifth the volume of the ultrapure water, and the volume of the hydrogen peroxide water is more than or equal to one tenth and less than or equal to one fifth the volume of the ultrapure water. Next, in the step of cleaning with the hydrofluoric acid (S35), a silicon oxide film is removed by the hydrofluoric acid. The hydrofluoric acid in a mixed solution prepared by mixing the hydrofluoric acid and ultrapure water has a concentration of 30%, for example. Preferably, the hydrofluoric acid in the mixed solution has a concentration of more than or equal to 20% and less than or equal to 50%. The treatment time in each of the above steps (S31) to (S35) is, for example, 30 minutes. The treatment time is preferably more than or equal to 15 minutes, and is more preferably more than or equal to 30 minutes.

In each of the above steps (S31) to (S35), silicon carbide substrate 10 is at room temperature, for example. Preferably, in each step, silicon carbide substrate 10 is set to have a temperature of less than or equal to 40° C.

As described above, silicon carbide substrate 10 (FIG. 1) having main surface 10A, with a metal concentration reduced by the cleaning step (S30) is obtained.

The cleaning step (S30) in the method for manufacturing silicon carbide substrate 10 in accordance with the present embodiment is not limited to the one described above. Variations of the cleaning step (S30) will be described below.

(First Variation)

Figure 8:
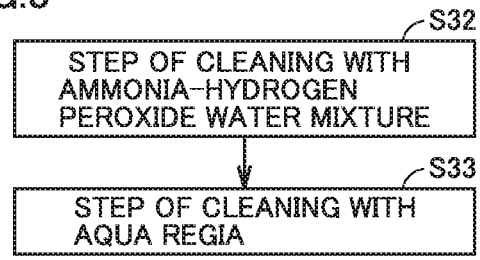
FIG. 8 is a flowchart for schematically illustrating a cleaning method in accordance with a first variation.

As shown in FIG. 8, the cleaning step includes a plurality of steps performed in order of cleaning with an ammonia-hydrogen peroxide water mixture (S32) and cleaning with aqua regia (S33), for example. A step of cleaning with ultrapure water may be performed after each step of cleaning is finished. It should be noted that an alkali cleaning step may be performed before the step of cleaning with a sulfuric acid-hydrogen peroxide water mixture.

(Second Variation)

Figure 9:
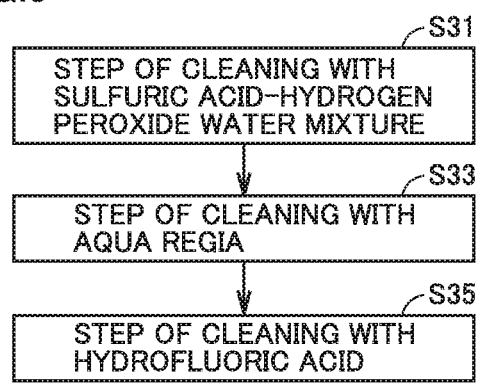
FIG. 9 is a flowchart for schematically illustrating a cleaning method in accordance with a second variation.

As shown in FIG. 9, the cleaning step includes a plurality of steps performed in order of cleaning with a sulfuric acid-hydrogen peroxide water mixture (S31), cleaning with an ammonia-hydrogen peroxide water mixture (S32), cleaning with aqua regia (S33), and cleaning with hydrofluoric acid (S35), for example. A step of cleaning with ultrapure water may be performed after each step of cleaning is finished. It should be noted that an alkali cleaning step may be performed before the step of cleaning with the sulfuric acid-hydrogen peroxide water mixture.

EXAMPLE

Table 1 shows the relation between concentrations of metals existing in main surface 10A and a method of cleaning silicon carbide substrate 10.

TABLE 1

| | Samples 1 to 3 |
|---|---|
| Cleaning Solution Treatment Temperature Treatment Time | Sulfuric Acid-Hydrogen Peroxide Water Mixture (1:1:1) Room Temperature/30 Minutes Ammonia-Hydrogen Peroxide Water Mixture (1:1:10) Room Temperature/30 Minutes Aqua Regia (3:1) Room Temperature/30 Minutes Hydrochloric Acid-Hydrogen Peroxide Water Mixture (1:1:10) Room Temperature/30 Minutes Hydrofluoric Acid (30%) Room Temperature/30 Minutes |

Silicon carbide substrate 10 for each of samples 1 to 3 was manufactured by the manufacturing; method in accordance with the first embodiment.

Details of the cleaning step (S30) for each of samples 1 to 3 wilt be described below. First, the step of cleaning with the sulfuric acid-hydrogen peroxide water mixture (S31) was performed. The volume ratio among the sulfuric acid, the hydrogen peroxide water, and the ultrapure water contained in the sulfuric acid-hydrogen peroxide water mixture was 1 (sulfuric acid):1 (hydrogen peroxide water):1 (ultrapure water). In the step of cleaning with the sulfuric acid-hydrogen peroxide water mixture (S31), the treatment time was 30 minutes, and the sulfuric acid-hydrogen peroxide water mixture was at room temperature.

Next, the step of cleaning with the ammonia-hydrogen peroxide water mixture (S32) was performed. The volume ratio among the aqueous ammonia solution, the hydrogen peroxide water, and the ultrapure water contained in the ammonia-hydrogen peroxide water mixture was 1 (aqueous ammonia solution):1 (hydrogen peroxide water):10 (ultrapure water). In the step of cleaning with the ammonia-hydrogen peroxide water mixture (S32), the treatment time was 30 minutes, and the ammonia-hydrogen peroxide water mixture was at room temperature.

Next, the step of cleaning with the aqua regia (S33) was performed. The volume ratio among the hydrochloric acid, the nitric acid, and the ultrapure water contained in the aqua regia was 3 (hydrochloric acid):1 (nitric acid):0 (ultrapure water). In the step of cleaning with the aqua regia (S33), the treatment time was 30 minutes, and the aqua regia was at room temperature.

Next, the step of cleaning with the hydrochloric acid-hydrogen peroxide water mixture (S34) was performed. The volume ratio among the hydrochloric acid, the hydrogen peroxide water, and the ultrapure water contained in the hydrochloric acid-hydrogen peroxide water mixture was 1 (hydrochloric, acid):1 (hydrogen peroxide water) 10 (ultrapure water). In the step of cleaning with the hydrochloric acid-hydrogen peroxide water mixture (S34), the treatment time was 30 minutes, and the aqua regia was at room temperature.

Next, the step of cleaning with the hydrofluoric acid (S35) was performed. The hydrofluoric acid in a mixed solution prepared by mixing the hydrofluoric acid and ultrapure water had a concentration of 30%. In the step of cleaning with the hydrofluoric acid (S35), the treatment time was 30 minutes, and the hydrofluoric acid was at room temperature. That is, in the cleaning step (S30) for each of samples 1 to 3, silicon carbide substrate 10 during cleaning was set to have a temperature of less than or equal to 40° C. This cleaning step is entirely performed at room temperature, due to the following reason. Since silicon carbide is chemically inert, it takes a long time to oxidize its surface and perform lift-off. In conventional cleaning such as so-called RCA cleaning, a sulfuric acid-hydrogen peroxide water mixture and a hydrochloric acid-hydrogen peroxide water mixture at a high temperature are used. However, when a sulfuric acid-hydrogen peroxide water mixture and a hydrochloric acid-hydrogen peroxide water mixture at a high temperature are used to clean silicon carbide, the sulfuric acid-hydrogen peroxide water mixture and the hydrochloric acid-hydrogen peroxide water mixture evaporate during cleaning treatment, and thus the cleaning effect is reduced. Accordingly, silicon carbide is preferably cleaned at room temperature.

(Measurement Method)

For each of samples 1 to 3, concentrations of metals existing in main surface 10A were measured. For sample 1, concentrations of vanadium (V), tungsten (W), molybdenum (Mo), platinum (Pt), nickel (Ni), titanium (Ti), chromium (Cr), iron (Fe), copper (Cu), zinc (Zn), aluminum (Al), sodium (Na), calcium (Ca), potassium (K), and tin (Sn) were measured. For samples 2 and 3, concentrations of vanadium (V) and zinc (Zn) were measured. The concentrations of the metals were measured by ICP-MS. Tables 2 and 3 show measurement results of the concentrations of the metals in main surface 10A of sample 1. Table 2 shows measurement results of the concentrations of metal catalysts existing in main surface 10A.

TABLE 2

| | [×10$^9$ atoms/cm$^2$] | | | | | |
|---|---|---|---|---|---|---|
| V | W | Mo | Pt | Ni | Ti | Cr |
| Sample 1 28 | 12 | 7 | 60 | 0.2 | 110 | 0.1 |

As shown in Table 2, for each of vanadium (V), tungsten (W), molybdenum (Mo), platinum (Pt), nickel (Ni), titanium (Ti), and chromium (Cr), the metal concentration indicates a value which is less than or equal to $1.0\times10^{12}$ atoms/cm$^2$, in main surface 10A of sample 1. The concentrations of vanadium (V) existing in main surface 10A of sample 2 and main surface 10A of sample 3 were $72\times10^9$ atoms/cm$^2$ and $16\times10^9$ atoms/cm$^2$, respectively.

Table 3 shows Measurement results of the concentrations of metals existing in main surface 10A other than the metal catalysts. It should be noted that "ND" in Table 3 indicates that the concentration was undetectable because it was lower than a detection lower limit value ($1\times10^7$ atoms/cm$^2$).

TABLE 3

| | [×10$^9$ atoms/cm$^2$] | | | | | | | |
|---|---|---|---|---|---|---|---|---|
| | Fe | Cu | Zn | Al | Na | Ca | K | Sn |
| Sample 1 | 1.1 | 0.9 | 23 | 0.3 | 0.2 | 8 | ND | ND |

As shown in Table 3, iron (Fe), copper (Cu), zinc (Zn), aluminum (Al), sodium (Na), calcium (Ca), potassium (K), and tin (Sn) were confirmed as the metals other than the metal catalysts, in main surface 10A of sample 1. However, it was confirmed that these metals in main surface 10A of sample 1 each had a concentration lower than $1\times10^{11}$ atoms/cm$^2$. The concentrations of zinc (Zn) existing in main surface 10A of sample 2 and main surface 10A of sample 3 were $16\times10^9$ atoms/cm$^2$ and $21\times10^9$ atoms/cm$^2$, respectively.

It should be understood that the embodiment disclosed herein is illustrative and non-restrictive in every respect. The scope of the present invention is defined by the scope of the claims, rather than the embodiment described above, and is intended to include any modifications within the scope and meaning equivalent to the scope of the claims.

REFERENCE SIGNS LIST

10: silicon carbide substrate; 10A: main surface; 11A: main surface; 20: epitaxial layer; 30: metal impurity; 100: polishing apparatus; 101: substrate holding portion 102: polishing cloth; 104: turn table portion; 106: shaft; 108: polishing agent supplying portion; 110: polishing agent; 120: cleaning apparatus 122: cleaning treatment tank; 124: pump; 126: filter; 128: heater.

The invention claimed is:

1. A silicon carbide substrate having a main surface,
    the main surface having a surface roughness (Ra) of less than or equal to 0.1 nm, and
    vanadium, tungsten, molybdenum, platinum, nickel, titanium, zirconium, and chromium each having a concentration of less than or equal to $1.0\times10^{12}$ atoms/cm$^2$ in the main surface,
    wherein molybdenum has a concentration of more than or equal to $1.0\times10^6$ atoms/cm$^2$ in the main surface.

2. The silicon carbide substrate according to claim 1, wherein vanadium, tungsten, molybdenum, platinum, nickel, titanium, zirconium, and chromium each have a concentration of less than or equal to $2.0\times10^{11}$ atoms/cm$^2$ in the main surface.

3. The silicon carbide substrate according to claim 1, wherein potassium, sodium, calcium, iron, copper, aluminum, and tin each have a concentration of less than or equal to $1.0\times10^{10}$ atoms/cm$^2$ in the main surface.

4. The silicon carbide substrate according to claim 1, having a diameter of more than or equal to 100 mm.

* * * * *